United States Patent [19]

Venkatesan et al.

[11] Patent Number: 5,736,435
[45] Date of Patent: Apr. 7, 1998

[54] PROCESS FOR FABRICATING A FULLY SELF-ALIGNED SOI MOSFET

[75] Inventors: Suresh Venkatesan; Stephen Poon; Jeffrey Lutze; Sergio Ajuria, all of Austin, Tex.

[73] Assignee: Motorola, Inc., Schuamburg, Ill.

[21] Appl. No.: 497,317

[22] Filed: Jul. 3, 1995

[51] Int. Cl.$^6$ .................. H01L 21/00; H01L 21/84; H01L 21/336; H01L 21/3205

[52] U.S. Cl. .............. 438/151; 438/270; 438/282; 438/589

[58] Field of Search .................. 437/21, 40 FT, 437/41 RG, 41 TFT, 203, 62, 44, 45, 40 GS, 41 GS; 257/347, 348, 349, 350, 351, 352, 353, 354; 153/636.1; 430/151, 270, 282, 589

[56] References Cited

U.S. PATENT DOCUMENTS

| | | | |
|---|---|---|---|
| 4,536,782 | 8/1985 | Brown | 257/346 |
| 4,845,537 | 7/1989 | Nishimura et al. | 357/23.4 |
| 4,864,374 | 9/1989 | Banerjee | 357/23.6 |
| 4,874,718 | 10/1989 | Inoue | 437/62 |
| 5,110,757 | 5/1992 | Arst et al. | 437/89 |
| 5,124,768 | 6/1992 | Mano et al. | 357/23.7 |
| 5,166,084 | 11/1992 | Pfiester | 437/40 |
| 5,231,038 | 7/1993 | Yamaguchi et al. | 437/41 RG |
| 5,238,865 | 8/1993 | Eguchi | 437/62 |
| 5,270,257 | 12/1993 | Shin | 437/41 RG |
| 5,273,921 | 12/1993 | Neudeck et al. | 437/41 |
| 5,300,447 | 4/1994 | Anderson | 437/40 RG |
| 5,315,144 | 5/1994 | Cherne | 257/347 |
| 5,434,093 | 7/1995 | Chau | 437/41 |
| 5,439,836 | 8/1995 | Giffard | 437/21 |
| 5,485,028 | 1/1996 | Takahashi et al. | 257/347 |
| 5,583,064 | 12/1996 | Lee et al. | 437/41 RG |
| 5,583,065 | 12/1996 | Miwa | 431/203 |

OTHER PUBLICATIONS

Kusunoki, et al."Hot–Carrier–Resistant Structure by Re–Oxidized Nitrided Oxide Sidewall for Highly Reliable and High Performance LDD Mosfets", 1991 IEEE, pp. 25.4.1–4.

Tsui, et al., "Poly Reoxidation Time and Temperature Effects on Reverse Short Channel Characteristics", pp. 1–13.

Colinge, et al., Silicon–On–Insulator "Gate–All–Around Device", 1990 IEEE, pp. 25.4.1–4.

Tanaka, et al., "Ultrafast Operation of Vth–Adjusted p+–n+ Double–Gate SOI MOSFET's", 1994 IEEE Electron Device Ltrs., vol. 15, No. 10, pp. 386–388.

Balestra, et al., "Double–Gate Silicon–on–Insulator Transistor with Vol. Inversion:A New Device with Greatly Enhanced Performance", Sep. 1987 IEEE Electronic Device Ltrs., vol. EDL–8, No. 9, pp. 410–411.

Hieda, et al., "Floating–Body Effect Free Concave SOI–MOSFETs (COSMOS)", 1991 IEDM, pp. 26.2.1–4.

Hwang, et al.. "High Performance Submicron SOI/MOS With an Elevated Source/Drain Structure", 1993 IEEE, pp. 132–133.

Mizuno, et al., "High Speed and Highly Reliable Trench MOSFET with Dual–Gate", pp. 23–24.

Takato, et al., "High Performance CMOS Surrounding Gate Transistor (SGT) for Ultra High Density LSIs", 1988 IEEE, pp. 222–225.

*Primary Examiner*—Brian Dutton
*Attorney, Agent, or Firm*—George R. Meyer

[57] ABSTRACT

A process for fabricating a MOSFET on an SOI substrate includes the formation of an active region (14) isolated by field isolation regions (16, 18) and by an insulating layer (12). A recess (26) is formed in the active region (14) using a masking layer (22) having an opening (24) therein. A gate dielectric layer (32) is formed in the recess (26) and a polycrystalline silicon layer (34) is deposited to overlie the masking layer (22), and to fill the recess (26). A planarization process is carried out to form a gate electrode (36) in the recess (26), and source and drain regions (40, 42) are formed in a self-aligned manner to the gate electrode (36). A channel region (44) resides intermediate to the source and drain regions (40, 42) and directly below the gate electrode (36).

12 Claims, 3 Drawing Sheets

PROCESS FOR FABRICATING A FULLY SELF-ALIGNED SOI MOSFET

RELATED APPLICATION

Related subject matter is disclosed in the commonly-assigned U.S. patent application Ser. No. 08/498,709 and filed on even date.

FIELD OF THE INVENTION

This invention relates, in general, to a method for fabricating a semiconductor device, and more particularly, to a method for fabricating a MOSFET on an SOI substrate.

BACKGROUND OF THE INVENTION

In the manufacture of semiconductor devices a large number of individual transistors are formed upon a single silicon substrate. These devices are interconnected to form complex circuits known as integrated circuits. In order to provide increased functional capability, integrated circuit devices are continually redesigned to smaller and smaller geometric dimensions. By reducing the dimensions of the individual transistors, higher levels of integration can be attained, while avoiding the need to increase the substrate surface area. Although reducing transistor dimensions increases the functional performance of an integrated circuit, transistors can suffer a loss of performance when scaled to dimensions below one micron.

As transistors are continually scaled in keeping with the requirements of advancing technology, device reliability dictates a concomitant reduction in the power supply voltage. Hence, every successive technology generation is often accompanied by a reduction in the operational voltage of the transistor. It is known that transistor devices fabricated on silicon-on-insulator (SOI) substrates exhibit better performance at low operating voltages than do transistors of similar dimensions fabricated in bulk silicon substrates. The superior performance of SOI devices at low operating voltage is related to the relatively lower junction capacitances obtained an SOI device compared to a bulk silicon device of similar dimensions. The buried oxide layer in an SOI device separates active transistor regions from the silicon substrate, thus reducing junction capacitance.

Transistors fabricated in SOI substrates offer several performance advantages over transistors fabricated in bulk silicon substrates. For example, complimentary-metal-oxide-semiconductor (CMOS) devices fabricated in SOI substrates are not prone to disabling capacitive coupling, known as latch-up. In addition, transistors fabricated in SOI substrates, in general, have large drive currents and high transconductance values. Also, the sub-micron SOI transistors have improved immunity to short-channel effects when compared with bulk transistors fabricated to similar dimensions.

Although SOI devices offer performance advantages over bulk silicon devices of similar dimensions, SOI devices share certain performance problems common to all thin-film transistors. For example, the active elements of an SOI transistor are fabricated in a thin-film layer. Scaling of thin-film transistors to smaller dimensions requires that the thickness of the thin-film layers be reduced. However, as the thickness of a thin-film is reduced, the electrical resistance of the thin-film layer correspondingly increases. This can have a negative impact on transistor performance because the fabrication of transistor elements in a conductive body having a high electrical resistance reduces the drive current of the transistor. Additionally, the threshold voltage of an SOI device can vary with variations in the thickness of the thin-film layer.

In order to address the series resistance problem, thin-film SOI MOS-field-effect-transistor (MOSFET) devices are designed having elevated source and drain regions. See, for example, "High Performance Submicron SOI/CMOS With An Elevated Source/Drain Structure", J. M. Hwang, et al., 1993 International SOI Conference, p. 132. By forming elevated source and drain regions, the series resistance of the SOI device is improved. However, during fabrication, typically, several critical lithographic alignment steps are required to precisely align the active elements of such an SOI device. Any misalignment of the active elements of an SOI transistor will increase the Miller capacitance and the series resistance of the transistor. Additionally, production costs rise when more lithographic alignment steps are required. Accordingly, a need existed for a manufacturable process for the fabrication of an SOI MOSFET having fully self-aligned active elements.

SUMMARY OF THE INVENTION

In practicing the present invention there is provided a process for fabricating a MOSFET on an SOI substrate. The process of the invention, provides an SOI MOSFET having fully self-aligned gate and source and drain regions. Furthermore, the process provides an SOI MOSFET having high current gain obtained by fabricating a relatively thin channel region that can be fully depleted, and relatively thick source and drain regions having a low electrical resistance. The process of the invention further provides a MOSFET having a gate electrode that is fully self-aligned to the channel region and to the source and drain regions. Furthermore, a process of the invention provides a fabrication method requiring a minimal number of critical lithographic alignment steps. In one embodiment of the invention, an SOI substrate is provided including a silicon layer overlying a semiconductor substrate and separated therefrom by an insulating layer. First and second isolation regions are formed in the silicon layer to define an active region therebetween, and the active region and the isolation regions are planarized to form a planar surface. A masking layer is formed on the planar surface, and a trench is formed in the active region through an opening in the masking layer. A gate dielectric layer is formed in the trench, and a layer of gate electrode forming material is deposited to fill the trench. The gate electrode forming material is then planarized to form a gate electrode in the trench. Finally, source and drain regions are formed in the active region on either side of the gate electrode defining a channel region intermediate to the source and drain regions.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DETAILED DESCRIPTION OF PREFERRED EMBODIMENTS

The present invention provides a process for the fabrication of a fully self-aligned SOI MOSFET. A MOSFET fabricated in accordance with the invention generates a large drive current through a fully depleted channel region. A low series resistance is maintained in the source and drain regions by fabricating the source and drain regions in a relatively thick silicon layer overlying an SOI substrate. The MOSFET fabricated in accordance with the invention takes full advantage of the large drive current available through the relatively thick source and drain regions by forming a first gate electrode that is fully self-aligned to the channel region, and to the source and drain regions. In an alternative embodiment of the invention, a second gate electrode is formed in a region of single crystal silicon which comprises a portion of the SOI substrate. The second gate electrode is also fully self-aligned to the channel region and to the first gate electrode. A particular advantage of the present invention includes the ability to fabricate an SOI MOSFET having fully self-aligned gate electrodes and thick source and drain regions using conventional processing techniques.

Figure 1:
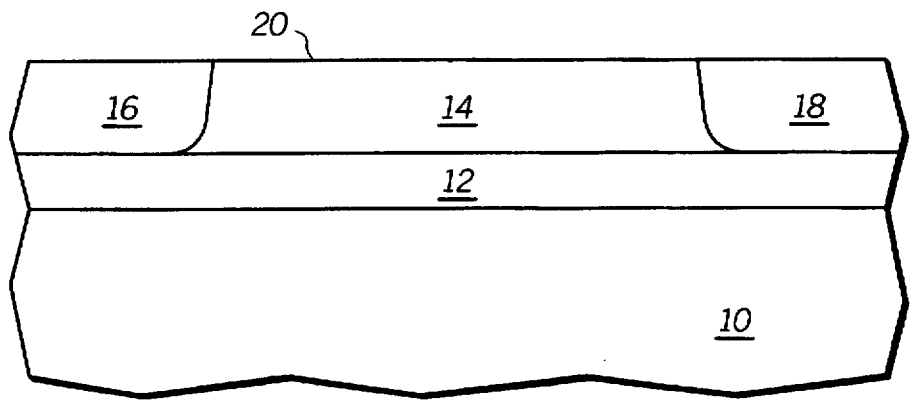
FIGS. 1–5 illustrate, in cross-section, process steps in accordance with the invention.

Shown in FIG. 1, in cross-section, is a portion of an SOI substrate having already undergone several process steps in accordance with the invention. The SOI substrate includes a single crystal silicon body 10 and an insulation layer 12. Insulation layer 12 electrically isolates an active region 14 from silicon body 10. Active region 14 is bounded by field isolation regions 16 and 18. Active region 14 and field isolation regions 16 and 18 are processed to form a planar surface 20.

The SOI substrate illustrated in FIG. 1 can be formed by a variety of processing techniques. In one method, an oxidation process is used to form insulation layer 12, followed by an epitaxial deposition process in which a seed layer is used to epitaxially deposit single crystal silicon over insulation layer 12. In another method, insulation layer 12 is formed as a buried oxide layer within a single crystal silicon body by oxygen ion implantation. In yet another method, oxidized silicon substrates are bonded, then polished to provide two single crystal silicon surfaces.

Additionally, field isolation regions 16 and 18 can be formed by a variety of methods. Preferably, a photolithographic mask is formed and a silicon etching process is carried out to form trenches on either side of active region 14. Then, silicon dioxide is deposited and a planarization process is carried out to form planar surface 20. Alternatively, a convention field oxidation process can be performed using an oxidation mask and a high temperature thermal oxidation process to form thick field oxide regions. After forming the thick field oxide regions, a planarization process is carried out to form planar surface 20. Additionally, advanced field oxidation processes using oxidizable buffer layers, and the like, can also be used to form field isolation regions 16 and 18.

Figure 2:
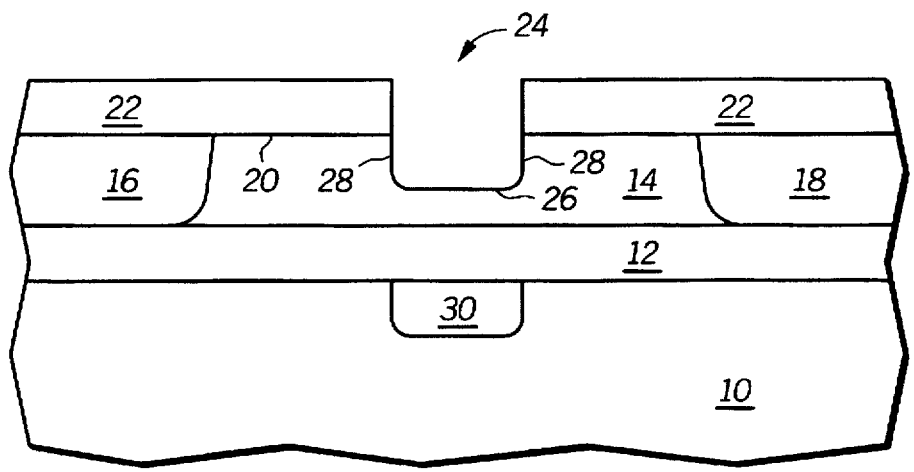

After forming field isolation regions 16 and 18, a masking layer 22 is formed to overlie planar surface 20 as illustrated in FIG. 2. Masking layer 22 is an insulating material that is differentially etchable with respect to polycrystalline silicon and to silicon dioxide. Preferably, masking layer 22 is formed by chemical vapor deposition of silicon nitride. After depositing masking layer 22, an opening 24 is formed in masking layer 22 and a recess 26 is etched in active region 14. To form recess 26, a sequential anisotropic etching process is carried out to etch both masking layer 22 and active region 14. The anisotropic etching process can be carried out by reactive ion etching (RIE) or by electron cyclotron resonance etching (ECR), or the like. The anisotropic etching process used to form recess 26 in active region 14 creates a vertical sidewall 28 in active region 14. Alternatively, a plasma or wet chemical isotropic etch can be used where the formation of a vertical sidewall is not required.

At this point in the process, the processing steps can vary depending upon whether a single-gate or a dual-gate MOSFET is to be fabricated. In an optional configuration of the invention, a dual-gate MOSFET is fabricated by forming a buried gate electrode 30 in silicon body 10. Preferably, buried gate electrode 30 is formed by an ion implantation process using masking layer 22 as a doping mask. The conductivity of the dopant implanted to form buried gate electrode 30 will depend upon the particular type of MOSFET to be fabricated. For example, where an n-channel device is fabricated, buried gate electrode 30 will preferably be formed by the implantation of n-type dopants, such as phosphorus or arsenic. Alternatively, where a p-type device is to be fabricated, buried gate electrode 30 is formed by implanting boron into silicon body 10. Although either an n-type or a p-type MOSFET can be fabricated in accordance with the present invention, the fabrication of an n-type device will be described herein. For the fabrication of a n-type device, silicon body 10 is preferably doped to have a p-type conductivity.

To set the threshold voltage of the MOSFET, a sacrifical oxide layer (not shown) is formed in recess 26, and boron is implanted into active region 14 through opening 24. Following the threshold adjust implant, the sacrificial oxide layer is preferably removed by a wet etching process, or by another isotropic etching technique.

Figure 3:
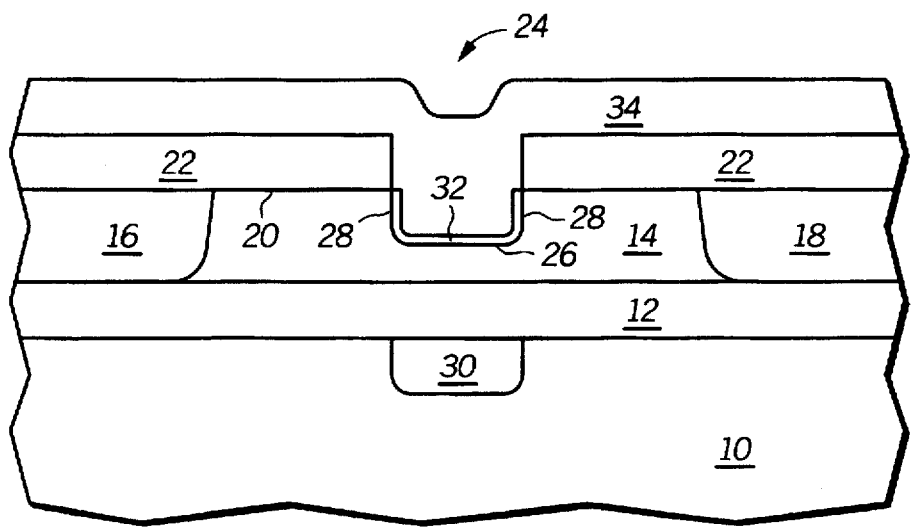

Referring to FIG. 3, after implanting boron into active region 14, a gate dielectric layer 32 is formed in recess 26. Preferably, gate dielectric layer 32 is formed by the thermal oxidation of active region 14. The formation of the gate dielectric layer is confined to recess 26, because masking layer 22 prevents oxidation of active region 14 at planar surface 20. Next, a layer of gate electrode forming material 34 is deposited to overlie masking layer 22, and to fill recess 26. The gate electrode forming material is preferably polycrystalline silicon. Alternatively, the gate forming material can be a refractory metal, such as tungsten, molybdenum, titanium, and the like, or a refractory metal silicide.

For the fabrication of an n-channel device, preferably polycrystalline silicon is deposited and doped with an n-type dopant, such as phosphorus or arsenic. The doping process can be carried out either simultaneously with the polycrystalline silicon deposition, or alternatively, by a separate doping step carried out immediately after the deposition step. In yet another alternative, the polycrystalline silicon is doped at the same time that source and drain regions are formed in the active region 14.

Figure 4:
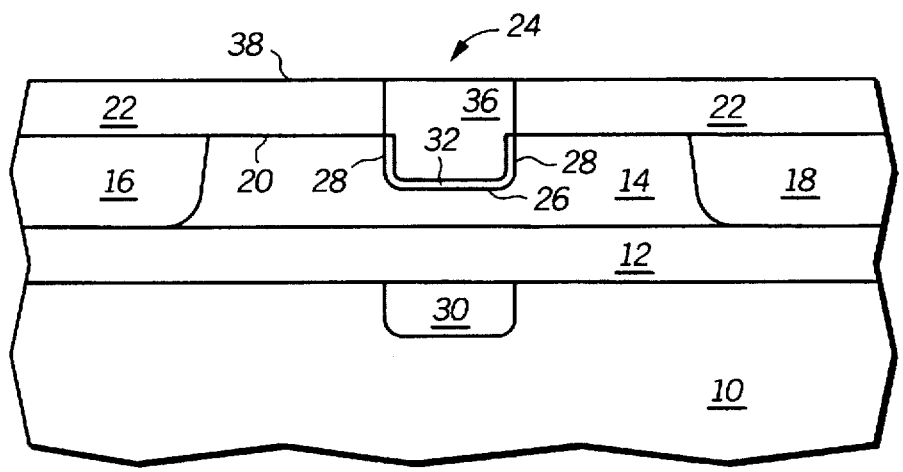

Once gate electrode forming material 34 is deposited, a planarization process is carried out to form a gate electrode 36, as illustrated in FIG. 4. The planarization process selectively removes polycrystalline silicon in preference to a dielectric material, such as silicon nitride or silicon dioxide. Preferably, a chemical-mechanical-polishing (CMP) process is used to selectively remove polycrystalline silicon layer 34 and form a second planar surface 38. The CMP process is preferably carried out in a polishing apparatus having a rotating polishing wheel and a polyurethane polishing pad disposed on the polishing wheel. A polishing slurry comprised of colloidal silica suspended in potassium hydroxide is applied to the polishing pad, and polycrystalline silicon layer 34 is removed until masking layer 22 is reached. Upon exposure of masking layer 22, the material removal rate substantially decreases such that second planar surface 38 is formed as a continuous surface over masking layer 22, and over the remaining portions of polycrystalline silicon layer 34 residing in opening 24.

It is important to note that through the fabrication of second planar surface 38 the vertical thickness of gate electrode 36 is determined, in part, by the thickness of masking layer 22 remaining after the CMP process. Accordingly, the vertical height of gate electrode 36 above planar surface 20 is substantially determined by the deposition thickness of masking layer 22. By fabricating gate electrode 36 to protrude above planar surface 20, electrical contact by overlying interconnect structures can be reliably made. In addition to specifying the vertical dimensions of gate electrode 36, masking layer 22 also provides a means of aligning gate electrode 36 to recess 26 located at a predetermined location within active region 14. Using masking layer 22, gate electrode 36 is fully fabricated by the processing steps of chemical vapor deposition and CMP. Therefore, the critical alignment of a photolithographic mask is not required in the process of the present invention for the fabrication of a gate electrode.

Figure 5:
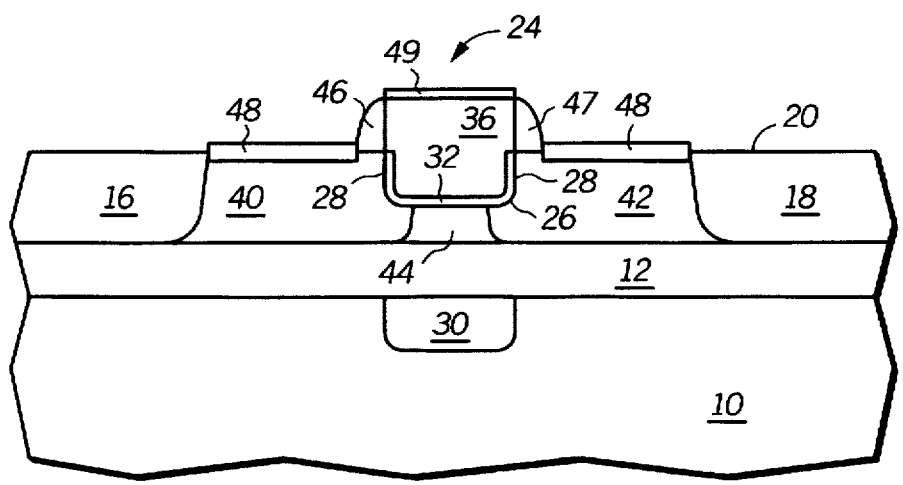

After forming second planar surface 38, masking layer 22 is removed, as illustrated in FIG. 5. The removal of masking layer 22 exposes a portion of gate electrode 36 protruding above planar surface 20. The region of gate electrode 36 protruding above planar surface 20 provides a site for the formation of insulating sidewall spacers using convention processing techniques. As will subsequently be described, further processing steps, such as silicide formation, and the like, can also be carried out to reduce the electrical resistance of a surface portion of gate electrode 36 to facilitate contact formation, and to improve the performance of the MOSFET.

Once masking layer 22 is removed, source and drain regions 40 an 42 are formed in active region 14. Source and drain regions 40 and 42 are aligned to vertical sidewall 28 of recess 26. A channel region 44 resides in active region 14 intermediate to source and drain regions 40 and 42 and directly below gate electrode 36. A sidewall spacer 46 can be formed adjacent to the edges of gate electrode 36 by depositing and anisotropically etching and insulating material, such as silicon dioxide or silicon nitride. The process of the invention advantageously produces a protruding portion of the gate electrode about which insulating sidewall spacers can be formed. Additionally, sidewall spacer 46 can be used to form source and drain extension regions (not shown) in source and drain regions 40 and 42. To form the extension regions, an ion implant process is carried out to lightly dope active region 14 prior to forming sidewall spacers 46 and 47. Then, a second ion implant process is carried out to heavily dope active region 14 using sidewall spacers 46 and 47 as an implant mask.

Electrical contact to gate electrode 36 and source and drain regions 40 and 42 can be enhanced by forming a refractory-metal region at the contact surfaces of the source and drain regions and the gate electrode. Refractory-metal regions 48 are preferably formed by depositing a refractory-metal layer (not shown) to overlie the gate electrode and the source and drain regions. A thermal process is then carried out to react the refractory-metal with silicon in the source and drain regions and the gate electrode to form a refractory-metal silicide. Sidewall spacers 46 and 47 prevent the formation of a silicide layer at the edges of gate electrode 36. Accordingly, upon completion of the thermal process, refractory-metal silicide layer 49 is electrically isolated from refractory-metal silicide regions 48 overlying source and drain regions 40 and 42. In this manner, the source and drain regions and the gate electrode can be separately contacted by individual interconnect leads.

It is important to note that on completion of the MOSFET, channel region 44, buried gate electrode 30, and gate electrode 36 are all fully self-aligned with each other, and to source and drain regions 40 and 42. The process of the invention provides a fully self-aligned SOI MOSFET using a minimum number of critical alignment steps. Accordingly, a high performance SOI MOSFET is fabricated using reliable deposition and etching processing steps, and a minimal number of difficult photolithographic steps requiring high precision critical alignment. Further, the MOSFET fabricated in accordance with the invention provides relatively thick source and drain regions, and a relatively thin channel region. The combination of thick source and drain regions and a thin channel region enables the channel region to be fully depleted when the MOSFET is turned on. In addition, the relatively thick source and drain regions provide a minimal electrical resistance. The combination of the fully depleted channel region and the low electrical resistance in the source and drain regions provides a high on current from the SOI MOSFET.

Figure 6:
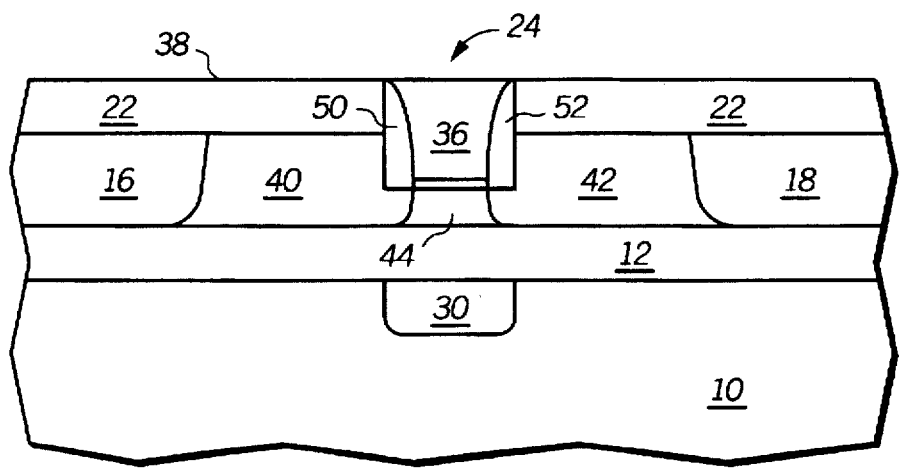
FIG. 6 illustrates, in cross-section, an alternative embodiment of the invention including the fabrication of a tapered gate electrode.

An alternative embodiment of the invention is illustrated in FIG. 6. To further enhance the performance of the SOI MOSFET, insulating sidewall spacers (50 and 51) are formed in opening 24 and in recess 26 adjacent to vertical sidewall 28. Insulating sidewall spacers (50 and 51) are formed at the processing stage illustrated in FIG. 2. Preferably, a layer of silicon dioxide is deposited to overlie masking layer 22 and recess 26. Then, the silicon dioxide is anisotropically etched to form sidewall spacers 50 and 51 in recess 26. Subsequent processing steps are then carried out as previously described to form second planar surface 38. The alternative embodiment illustrated in FIG. 6 advantageously configures gate electrode 36 to have a tapered geometry. The tapered configuration reduces the gate length of the SOI MOSFET while maintaining a relatively large surface area for electrical contact to the gate electrode. In addition, sidewall spacers 50 and 51 partially offset the gate electrode from the source and drain regions, which lowers the Miller capacitance of the MOSFET.

Figure 7:
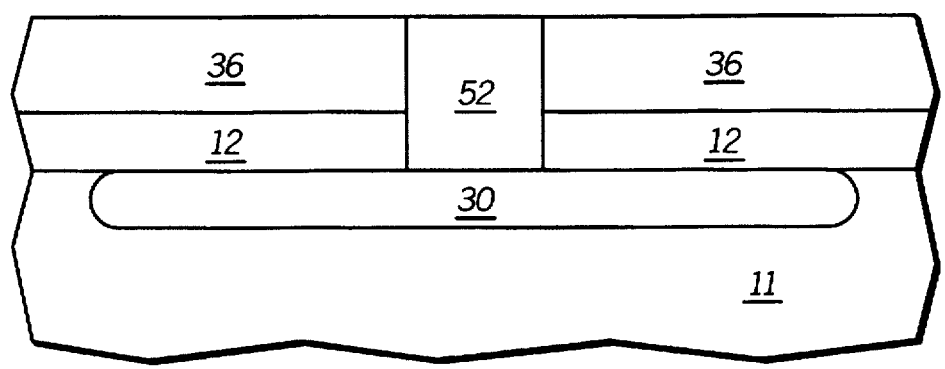
FIG. 7 illustrates, in cross-section, fabrication of an interconnect for electrically coupling a buried gate electrode and a surface electrode.

FIG. 7 illustrates, in cross-section, a lateral view of the dual-gate MOSFET embodiment of the invention. Buried gate electrode 30 is electrically coupled to gate electrode 36 by a refractory-metal plug 52. Refractory-metal plug 52 is formed by creating an opening in insulation layer 12 to expose a portion of buried gate electrode 30. Then, a layer of a refractory-metal, such as tungsten, is deposited into the opening and a planarization process is carried out to form the plug.

Thus it is apparent that there has been provided, in accordance with the invention, a process for fabricating a fully self-aligned SOI MOSFET, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, other dielectric materials, such as oxide-nitride-oxide (ONO) and spin-on-glass (SOG), and the like can be used. It is therefore intended to include within the invention all such variations and modifications as fall within the scope of the appended claims and equivalents thereof.

We claim:

1. A process for fabricating a MOSFET device comprising the steps of:

providing a single crystal silicon body having an insulating layer thereon, and a silicon layer overlying the insulating layer;

forming first and second isolation regions in the silicon layer defining an active region therebetween;

planarizing the first and second isolation regions and the active region to form a planar surface;

forming a masking layer on the planar surface, the masking layer having an opening therein exposing a portion of the planar surface at the active region;

forming a recess in the active region;

forming a first gate electrode in the single crystal silicon body;

forming a gate dielectric layer in the recess;

depositing a gate electrode forming material to fill the recess;

planarizing the gate electrode forming material to form a second gate electrode overlying the gate dielectric layer;

forming an opening through the second gate electrode and the insulating layer;

forming a refractory-metal plug in the opening through the second gate electrode and the insulating layer to electrically couple the first gate electrode to the second gate electrode; and forming source and drain regions in the active region on either side of the second gate electrode defining a channel region therebetween, wherein the first gate electrode is separated from the channel region by the insulating layer.

2. The process of claim 1, further comprising the steps of:

removing the masking layer to expose a wall surface of the first gate electrode prior the step of forming source and drain regions; and forming an insulating sidewall spacer adjacent to the wall surface.

3. The process of claim 1, further comprising the step of forming a second gate electrode in the single crystal silicon body, wherein the second gate electrode is separated from the channel region by the insulating layer.

4. The process of claim 3 further comprising the steps of:

forming an opening through the first gate electrode and the insulating layer; and forming a refractory-metal plug in the opening to electrically couple the first gate electrode to the second gate electrode.

5. The process of claim 1, further comprising the step of forming an insulating sidewall spacer in the recess prior to the step of forming a gate dielectric layer.

6. The process of claim 5, wherein the step of planarizing the gate electrode forming material comprises forming a gate electrode having a top surface and a bottom surface, wherein a lateral dimension of the top surface is greater than a lateral dimension of the bottom surface.

7. The process of claim 1, wherein all of the channel, source, and drain regions lie within the silicon layer.

8. A process for fabricating a MOSFET device comprising the steps of:

providing a single crystal silicon body having an insulating layer thereon, and a silicon layer overlying the insulating layer;

forming first and second isolation regions in the silicon layer defining an active region therebetween;

planarizing the first and second isolation regions and the active region to form a planar surface;

forming a masking layer on the planar surface, the masking layer having an opening therein exposing a portion of the planar surface at the active region;

forming a recess in the active region, the recess having substantially vertical sides;

implanting the active region through the opening in the masking layer to form a first gate electrode in the single crystal silicon body;

forming a first insulating sidewall spacer adjacent to the substantially vertical sides;

forming a gate dielectric layer in the recess;

depositing a gate electrode forming material to fill the recess;

planarizing the gate electrode forming material to form a second planar surface and to define a second gate electrode overlying the gate dielectric layer;

removing the masking layer to expose a wall surface of the gate electrode;

forming an opening through the second gate electrode and the insulating layer;

forming a refractory-metal plug in the opening through the second gate electrode and the insulating layer to electrically couple the first gate electrode to the second gate electrode;

forming a second insulating sidewall spacer adjacent to the wall surface;

forming source and drain regions in the active region on either side of the first gate electrode defining a channel region therebetween, wherein the first gate electrode is separated from the channel region by the insulating layer; and forming refractory-metal silicide regions in the source and drain regions and at an upper surface of the gate electrode.

9. The process of claim 8, further comprising the step of implanting the active region through the opening in the masking layer to form a second gate electrode in the single crystal silicon body, wherein the second gate electrode is separated from the channel region by the insulating layer.

10. The process of claim 9 further comprising the steps of:

forming an opening through the first gate electrode and the insulating layer; and forming a refractory-metal plug in the opening to electrically couple the first gate electrode to the second gate electrode.

11. The process of claim 8, wherein the step of depositing a gate electrode forming material comprises depositing a material selected from the group consisting of polycrystalline silicon, a refractory metal, and a refractory metal silicide.

12. The process of claim 8, wherein all of the channel, source, and drain regions lie within the silicon layer.

* * * * *